United States Patent [19]

Gagliardi

[11] Patent Number: 5,121,289
[45] Date of Patent: Jun. 9, 1992

[54] ENCAPSULATABLE SENSOR ASSEMBLY

[75] Inventor: Michael A. Gagliardi, Forreston, Ill.

[73] Assignee: Honeywell Inc., Minneapolis, Minn.

[21] Appl. No.: 472,940

[22] Filed: Jan. 31, 1990

[51] Int. Cl.$^5$ .......................... H05K 7/20; H01L 43/00
[52] U.S. Cl. .................................. 361/380; 174/52.2;
324/200; 338/32 R; 338/32 H
[58] Field of Search .................... 361/380, 417, 419;
174/52.2; 357/72, 27; 338/32 H, 32 R; 307/413,
414, 115; 324/219, 220, 234, 235, 200, 251;
73/313, 316

[56] References Cited

U.S. PATENT DOCUMENTS

| | | | |
|---|---|---|---|
| 3,672,046 | 6/1972 | Storey, II et al. | 29/624 |
| 3,823,254 | 7/1974 | Smith | 174/92 |
| 4,816,627 | 3/1989 | Janotik | 200/61.45 M |
| 4,888,989 | 12/1989 | Homer | 73/304 C |
| 4,920,797 | 5/1990 | Swartz et al. | 73/309 |
| 4,988,890 | 1/1991 | Narhi et al. | 307/147 |

FOREIGN PATENT DOCUMENTS 56-79551  6/1981  Japan .................. 333/22 R

Primary Examiner—Leo P. Picard
Assistant Examiner—Bot Ledinh
Attorney, Agent, or Firm—William D. Lanyi

[57] ABSTRACT

An encapsulatable sensor assembly includes an external housing with internal support components for retaining an active sensor element and associated electrical circuitry in a predetermined relationship while providing a plurality of internal sequentially interconnected cavities for facilitating a flow of an encapsulating material from an encapsulating material injection port to a vented overflow to assure a complete fill of the internal cavities to restrain the internal components. The sensor assembly provides a structure for a void free encapsulation and internal leadwire stress relief concurrently with location control of the internal components while also providing a combination which is easily adaptable to automatic assembly and encapsulation techniques.

3 Claims, 2 Drawing Sheets

1

ENCAPSULATABLE SENSOR ASSEMBLY

BACKGROUND OF THE INVENTION

1. Field of the Invention

The present invention relates to sensors. More specifically, the present invention is directed to a sensor assembly within a housing.

SUMMARY OF THE INVENTION

An object of the present invention is to provide a sensor assembly for facilitating encapsulation of sensor assembly components within a sensor housing.

In accomplishing this and other objects, there has been provided, in accordance with the present invention a sensor assembly having an external housing, an internal sensor components support structure located within the housing and including an encapsulation injection port and a vent and sequentially interconnected cavities located between the housing and the support structure for providing an encapsulation material path from said injection port to vent.

BRIEF DESCRIPTION OF THE DRAWINGS

A better understanding of the present invention may be had when the following detailed description is read in connection with the accompanying drawings, in which.

DESCRIPTION OF THE PREFERRED EMBODIMENT

Figure 1:
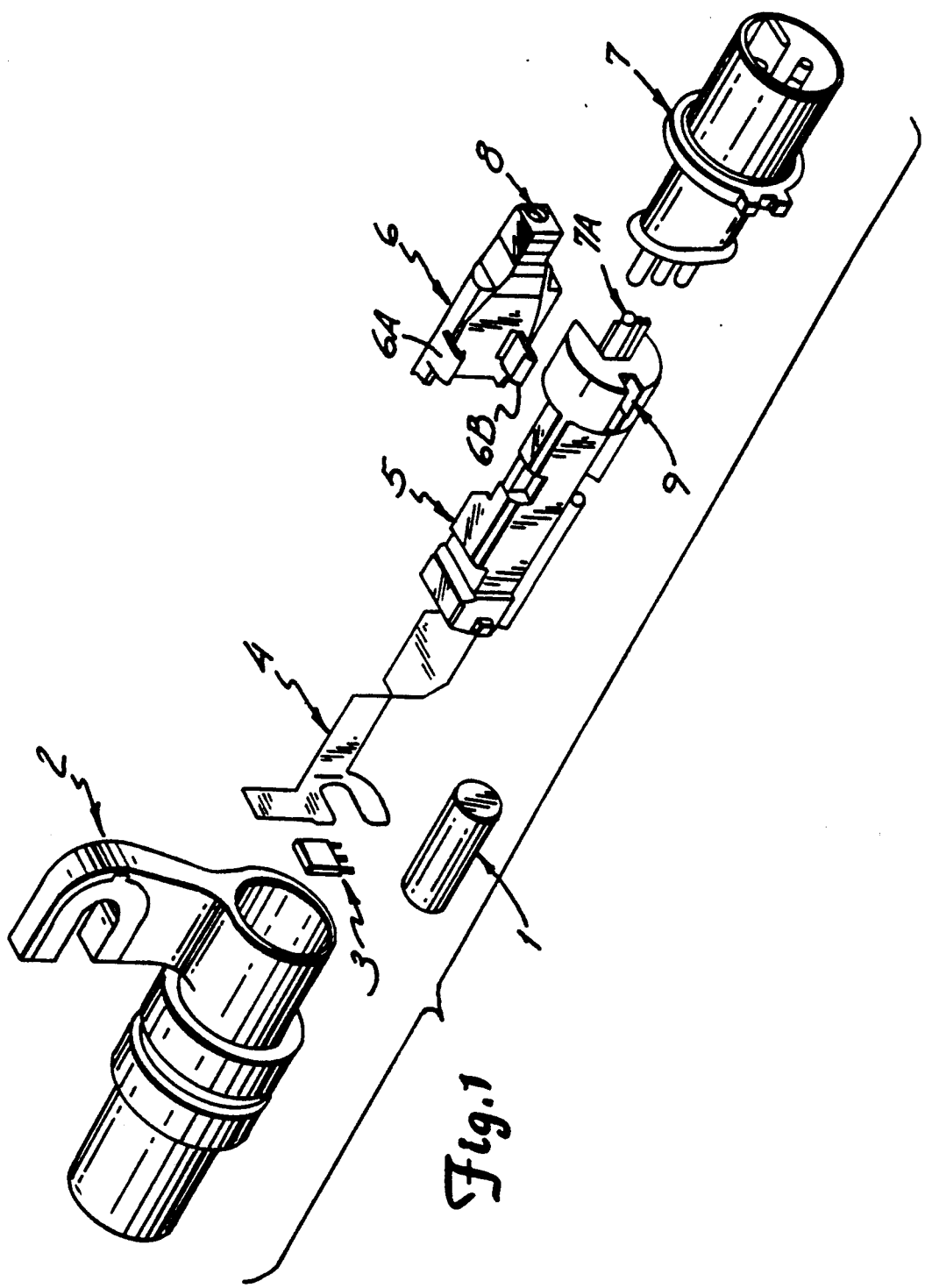
FIG. 1 is an exploded representation of a sensor assembly embodying an example of the present invention and FIG. 2 is cross-sectional illustration of an assembled version of the sensor assembly shown in FIG. 1.
Figure 2:
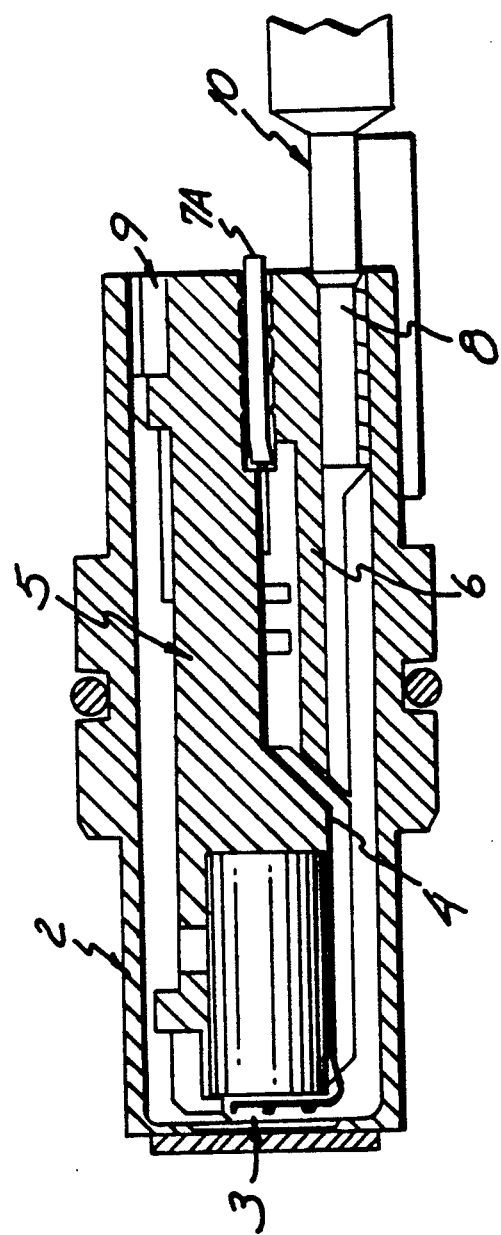

Referring to FIGS. 1 and 2 in more detail, the exploded representation of the sensor assembly shown in FIG. 1 and assembled cross-section in FIG. 2 are specifically directed to a so-called Hall effect sensor. This type of sensor utilizes a permanent magnet 1 which is located within a sensor housing 2 adjacent to an integrated circuit 3 supporting a Hall effect element. A flexible electrical circuit (I.C.) 4 containing a plurality of electrical conductors is used to provide electrical connections to the integrated circuit 3. An insert 5 or a suitable nonelectrically conductive material is arranged to provide a support and locating means for the magnet 1, the integrated circuit 3 and the flexible circuit 4. A cover 6 having projecting ears 6A and 6B is arranged to be mounted on the insert 5 with the ear 6A and 6B providing a means for firmly attaching the cover 6 to the insert 5 by grasping the insert 5. A leadwire connector 7 having electrical connection elements therein is used to connect the sensor to associated equipment (not shown) by a selective interconnection to electrical pins 7A extending from the insert 5 and being electrically connected to the flexible circuit 4.

A fill orifice 8 or port is provided in the cover 6 to receive an injection of encapsulation material and is connected through the cover 6 to sequentially interconnected cavities A and B between the insert 5 and the housing 2 to permit the flow of an encapsulation material from the fill orifice 8 through the cover 5 and into the cavities A and B around the insert 5. A vent and overflow passage 9 is provided in the insert 5 to effect a venting of the gases within the sensor assembly during the encapsulation process and to enable any overflow of the encapsulation material to be expelled whereby the encapsulation material fully fills the internal passages and cavities. Thus, the encapsulation is achieved in a void free manner and completely encapsulates the components within the housing 2, i.e., the magnet 1, the integrated circuit 3 and the flexible circuit 4. In other words, the vent and overflow 9 enables air to be purged from the internal cavities A and B as the encapsulation material is forced to travel between the internal cavities A and B from the fill orifice 8. As previously stated, a cross-sectional illustration of the sensor assembly shown in FIG. 1 is shown in FIG. 2 in an assembled state. In this illustration, the internal sequentially cavities A,B are more specifically delineated to illustrate the flowpath between the fill orifice 8 and the overflow vent 9. An example of a dispensing needle 10 for supplying the encapsulation material is shown in FIG. 2 to illustrate the encapsulation operation.

Accordingly, there may be shown that there has been provided, in accordance with the present invention, an improved sensor assembly suitable for encapsulation.

The embodiments of the present invention in which an exclusive property or privilege is claimed are defined as follows:

1. A sensor assembly, comprising:
   a housing enclosure;
   a sensor components support structure located within said housing enclosure;
   an electronic circuit disposed within said housing enclosure and attached to said structure, said circuit comprising a sensor element;
   a plurality of sequentially interconnected cavities located between said housing enclosure and said support structure for providing an encapsulation material path, said path being in fluid communication with said circuit;
   an injection port being formed in said housing enclosure; and
   a vent being formed in said housing enclosure, said path being disposed in fluid communication with said injection port and said vent, said path extending between said injection port and said vent.

2. An assembly as set forth in claim 1 wherein said element is a Hall effect element.

3. An assembly as set forth in claim 2 wherein said support structure is further arranged to support a permanent magnet operatively associated with said Hall effect element.

* * * * *